United States Patent
Yazdi et al.

(10) Patent No.: US 10,185,335 B2
(45) Date of Patent: Jan. 22, 2019

(54) SYSTEM AND METHOD FOR OVENIZED DEVICE TEMPERATURE CONTROL

(71) Applicant: Eviga Systems, Inc., Ann Arbor, MI (US)

(72) Inventors: Navid Yazdi, Ann Arbor, MI (US); Weibin Zhu, Saline, MI (US)

( * ) Notice: Subject to any disclaimer, the term of this patent is extended or adjusted under 35 U.S.C. 154(b) by 325 days.

(21) Appl. No.: 15/155,016

(22) Filed: May 14, 2016

(65) Prior Publication Data

US 2017/0115676 A1    Apr. 27, 2017

Related U.S. Application Data

(60) Provisional application No. 62/285,374, filed on Oct. 27, 2015.

(51) Int. Cl.
| | |
|---|---|
| *H05B 1/02* | (2006.01) |
| *G05D 23/20* | (2006.01) |
| *H03F 3/45* | (2006.01) |
| *G05D 23/19* | (2006.01) |
| *G05D 23/24* | (2006.01) |

(52) U.S. Cl.
CPC ..... *G05D 23/2033* (2013.01); *G05D 23/1928* (2013.01); *G05D 23/24* (2013.01); *H03F 3/45475* (2013.01); *H03F 2203/45594* (2013.01)

(58) Field of Classification Search
CPC ............. G05D 23/2033; G05D 23/24; G05D 23/2401; H03F 3/45475; H03F 3/4547; H03F 2203/45594; H05B 1/0288; H05B 1/0275; H05B 3/0038; H05B 1/023; H05B 2203/035

USPC ................ 219/209, 210, 497, 499, 505, 501
See application file for complete search history.

(56) References Cited

U.S. PATENT DOCUMENTS

| | | |
|---|---|---|
| 3,771,095 A | 11/1973 | Calhoun |
| 4,985,687 A | 1/1991 | Long |
| 5,063,305 A | 11/1991 | Minami |
| 5,530,408 A | 6/1996 | Vig |
| 5,659,270 A | 8/1997 | Millen |
| 5,917,272 A | 6/1999 | Clark |
| 8,049,326 B2 | 11/2011 | Najafi |

(Continued)

OTHER PUBLICATIONS

Donguk Yang, et. al, "2ppm frequency drift and 300x reduction of bias drift of commercial 6-axis inertial measurement units using a low-power oven-control micro platform", Proc. 2015 IEEE Sensor Conf., pp. 1-4.

(Continued)

*Primary Examiner* — Mark Paschall
(74) *Attorney, Agent, or Firm* — James M. Smedley LLC; James Michael Smedley, Esq.

(57) ABSTRACT

The present invention generally relates to a system and method for high accuracy temperature control of an oven used to operate an electronic device, sensor or resonator ("device") at a fixed temperature. The fixed temperature operation may result in high stability and operation accuracy of the devices across varying environment temperature conditions. Specifically, the present invention relates to systems and methods that enable realizing, sensing, and controlling the temperature of an ovenized device with high temperature control, accuracy, relaxed temperature sense, and control electronics requirements.

24 Claims, 4 Drawing Sheets

(56) References Cited

U.S. PATENT DOCUMENTS

| | | | |
|---|---|---|---|
| 2002/0190734 A1* | 12/2002 | Burt | H03F 3/347 324/713 |
| 2006/0261884 A1* | 11/2006 | Gammie | H03F 3/45192 330/9 |
| 2012/0268216 A1 | 10/2012 | Booremans | |
| 2013/0235903 A1 | 9/2013 | Wong | |

OTHER PUBLICATIONS

L. Hurley, "A temperature-controlled crystal oscillator," IEEE 43rd Annual Symposium on Frequency Control, 1989.
M. Vaish, "A high precision quartz oscillator with performance comparable to Rubidium oscillators in many respects," 1996 IEEE International Frequency Control Symposium.

* cited by examiner

SYSTEM AND METHOD FOR OVENIZED DEVICE TEMPERATURE CONTROL

CROSS-REFERENCE TO RELATED APPLICATIONS

This application claims priority to U.S. Provisional Patent Application No. 62/285,374, filed Oct. 27, 2015, the entire contents of which are incorporated herein by reference.

FIELD OF THE INVENTION

The present invention generally relates to a system and method for high accuracy temperature control of an oven used to operate an electronic device, sensor or resonator ("device") at a fixed temperature. The fixed temperature operation may result in high stability and operation accuracy of devices across varying environment temperature conditions.

BACKGROUND OF THE INVENTION

Over the past century, temperature sensitivity of crystal oscillators has been improved by applying temperature compensation algorithms based on the externally sensed ambient temperature. One type of crystal used is the temperature-compensated crystal oscillator (TXCO), a form of crystal oscillator employed where a precision frequency source is required within a small space and at reasonable cost. However, the best performing crystal oscillators rely on ovenization of the resonant device to provide the highest stability, such as the oven-controlled crystal oscillator (OCXO). The evolution of micro electro-mechanical systems (MEMS)-based inertial sensors is likely to follow a similar trajectory due to the similarity of vibrating MEMS devices to quartz oscillators. A typical sensor, resonator and electronics operation temperature range is −40° C. to 80° C., with extended range of −55° C. to 125° C. for industrial and military applications. See U.S. Pat. No. 5,917,272, "Oven-heated crystal resonator and oscillator assembly"; U.S. Pat. 4,985,687, "Low power temperature-controlled frequency-stabilized oscillator"; U.S. Pat. No. 5,530,408, "Method of making an oven controlled crystal oscillator the frequency of which remains ultrastable under temperature variations"; and U.S. Pat. No. 5,659,270, "Apparatus and method for a temperature-controlled frequency source using a programmable IC". At present, uncompensated MEMS inertial sensors are widely available for commercial applications and digital temperature compensation devices are emerging. Temperature stabilization has been demonstrated to improve long-term stability and reproducibility of MEMS inertial sensors in an academic setting, but has yet to be transitioned into marketable MEMS-based inertial sensors. Similar concepts of operating a resonator or MEMS inertial sensor at a fixed temperature can be applied to any other electronics device or sensor to provide high accuracy, high-stability performance across varying operation environment temperature. In U.S. Pat. No. 8,049,326 ("Environment-resistant module, micropackage and methods of manufacturing same"), K. Najafi et al. proposed an environmental-resistant packaging module to provide a temperature stabilization for inertial sensors on the platform. Dongguk Yang et al. presented a low-power oven control micro platform using glass substrate to achieve 300× improvement of temperature stability of the inertial sensors. See "±2 ppm frequency drift and 300× reduction of bias drift of commercial 6-axis inertial measurement units using a low-power oven-control micro platform", Proc. 2015 IEEE Sensor Conf., pp. 1-4.

Achieving a high-level of temperature control requires high-precision temperature sensors and electronics. The best commercially available temperature sensor chips provide a few parts per million (ppm) per degree Celsius stability, and thus hundreds of ppm drift over the entire operation temperature range. In addition, the drift of electronic voltage references or current sources required to form the temperature setting of the oven is at best in 2-3 ppm/° C., which will not meet many high stability applications requirements. Therefore, the temperature set point of the oven control platform may drift due to the temperature dependency of the temperature sensors and oven control electronics. For example, in Yang's article, an extra temperature sensor outside the packaged platform was still required to perform a further temperature compensation because the environmental temperature fluctuation may still affect the temperature and stress on the oven control platform.

Therefore, there is a need in the art for a system and method where the set temperature point of the oven control is not affected by the temperature dependency of the temperature sensor and electronics, but determined by the material properties independent of the reference electronic voltage or current. These and other features and advantages of the present invention will be explained and will become obvious to one skilled in the art through review of the present application.

SUMMARY OF THE INVENTION

Accordingly, several embodiments of the present invention are directed to methods that enable realizing, sensing, and controlling the temperature of an ovenized device with high temperature control, accuracy with relaxed temperature sense and control electronics requirements. The systems and methods described may be used in various MEMS-based inertial sensors for accelerometers, gyroscopes, pressure, temperature, humidity, strain, stress, mechanical shock, vibrations, impact, and blast. Manufacturing and packaging technologies may be combined to form single and multi-sensor miniature sensor systems. The sensor systems may be integrated atop of a low-power circuit chip using semiconductor and/or MEMS manufacturing technology. The combination and co-fabrication of the sensors, circuits, and packaging may be done on a single silicon chip or in a hybrid MEMS-IC package. The oven operation at fixed temperature may be achieved by using at least two resistors that have different temperature coefficients of electrical resistance (TCR), and matching the voltage drop across the resistors as part of a control loop to obtain a high-accuracy, stable, fixed oven temperature.

One embodiment of the invention relates to a system for controlling the temperature of a device, the system comprising:
   a first resistor;
   a second resistor;
   a current source;
      at least one current mirror for driving at least one of the first or second resistors,
   wherein the current mirror mirrors the current source;
   an amplifier configured to amplify a voltage difference between a first output voltage of the first resistor and a second output voltage of the second resistor; and
   a controller configured to control a heater, based on an output of the amplifier.

Another aspect of the present invention relates to an embodiment wherein the first resistor is driven by the current source and the second resistor is driven by the current mirror.

Another aspect of the present invention relates to an embodiment wherein the at least one current mirror drives the first resistor and a second current mirror drives the second resistor.

Another aspect of the present invention relates to an embodiment wherein the temperature is set by setting the voltage difference to zero.

Another aspect of the present invention relates to an embodiment wherein the voltage difference is set to zero at a set temperature based on the difference between a TCR of the first resistor and a TCR of the second resistor.

Another aspect of the present invention relates to an embodiment wherein the voltage difference is set to zero at a set temperature based on the fact that a TCR of the first resistor and a TCR of the second resistor have different values, and an initial resistance of the first resistor and an initial resistance of the second resistor have different values.

Another aspect of the present invention relates to an embodiment wherein the first resistor and the second resistor are constructed with different materials.

Another aspect of the present invention relates to an embodiment wherein the resistance values of the first and second resistors are set by their geometries.

Another embodiment of the invention relates to a system for controlling the temperature of a device, the system comprising:
  a first resistor driven by a first current source;
  a second resistor driven by a second current source;
  an amplifier configured to amplify a voltage difference between a first output voltage of the first resistor and a second output voltage of the second resistor; and
  a controller configured to control a heater, based on an output of the amplifier.

Another aspect of the present invention relates to an embodiment wherein the first and second current sources have the same current values.

Another aspect of the present invention relates to an embodiment wherein the first and second current sources have different current values.

Another aspect of the present invention relates to an embodiment wherein the temperature is set by setting the voltage difference to zero.

Another aspect of the present invention relates to an embodiment wherein the voltage difference is set to zero at a set temperature based on the difference between a TCR of the first resistor and a TCR of the second resistor.

Another aspect of the present invention relates to an embodiment wherein the voltage difference is set to zero at a set temperature based on the fact that a TCR of the first resistor and a TCR of the second resistor have different values, and an initial resistance of the first resistor and an initial resistance of the second resistor have different values.

Another aspect of the present invention relates to an embodiment wherein the first resistor and the second resistor are constructed with different materials.

Another aspect of the present invention relates to an embodiment wherein the resistance values of the first and second resistors are set by their geometries.

Another embodiment of the invention relate to a method of controlling a temperature of a device, the method comprising the steps of:
  heating the device;
  sensing the temperature;
  calculating a voltage difference between a first output voltage of a first resistor and a second output voltage of a second resistor;
  amplifying the voltage difference; and
  controlling a heater, based on the amplified voltage difference, in order to match the first output voltage of the first resistor with the second output voltage of the second resistor.

Another embodiment of the present invention relates to a method wherein a TCR of the first resistor is different than a TCR of the second resistor.

Another embodiment of the present invention relates to a method wherein the current in the first and second resistors are the same.

Another embodiment of the present invention relates to a method wherein the current in the first and second resistors are different.

Another embodiment of the present invention relates to a system for controlling the temperature of a device, the system comprising:
  a first resistor;
  a second resistor;
  a current source for driving the first resistor and the second resistor;
  an amplifier configured to amplify a voltage difference between a first output voltage of the first resistor and a second output voltage of the second resistor; and
  a controller configured to control a heater, based on an output of the amplifier.

Another aspect of the present invention relates to an embodiment wherein the temperature is set by setting the voltage difference to zero.

Another aspect of the present invention relates to an embodiment wherein the voltage difference is set to zero at a set temperature based on the difference between a TCR of the first resistor and a TCR of the second resistor.

Another aspect of the present invention relates to an embodiment wherein the voltage difference is set to zero at a set temperature based on the fact that a TCR of the first resistor and a TCR of the second resistor have different values, and an initial resistance of the first resistor and an initial resistance of the second resistor have different values.

Another aspect of the present invention relates to an embodiment wherein the first resistor and the second resistor are constructed with different materials.

Another aspect of the present invention relates to an embodiment wherein the resistance values of the first and second resistors are set by their geometries.

DETAILED SPECIFICATION

The present invention generally relates to a system and method for high accuracy temperature control of an oven used to operate an electronic device, sensor or resonator (device) at a fixed temperature. The fixed temperature operation may result in high stability and operation accuracy of the devices across varying environment temperature conditions.

Figure 1:
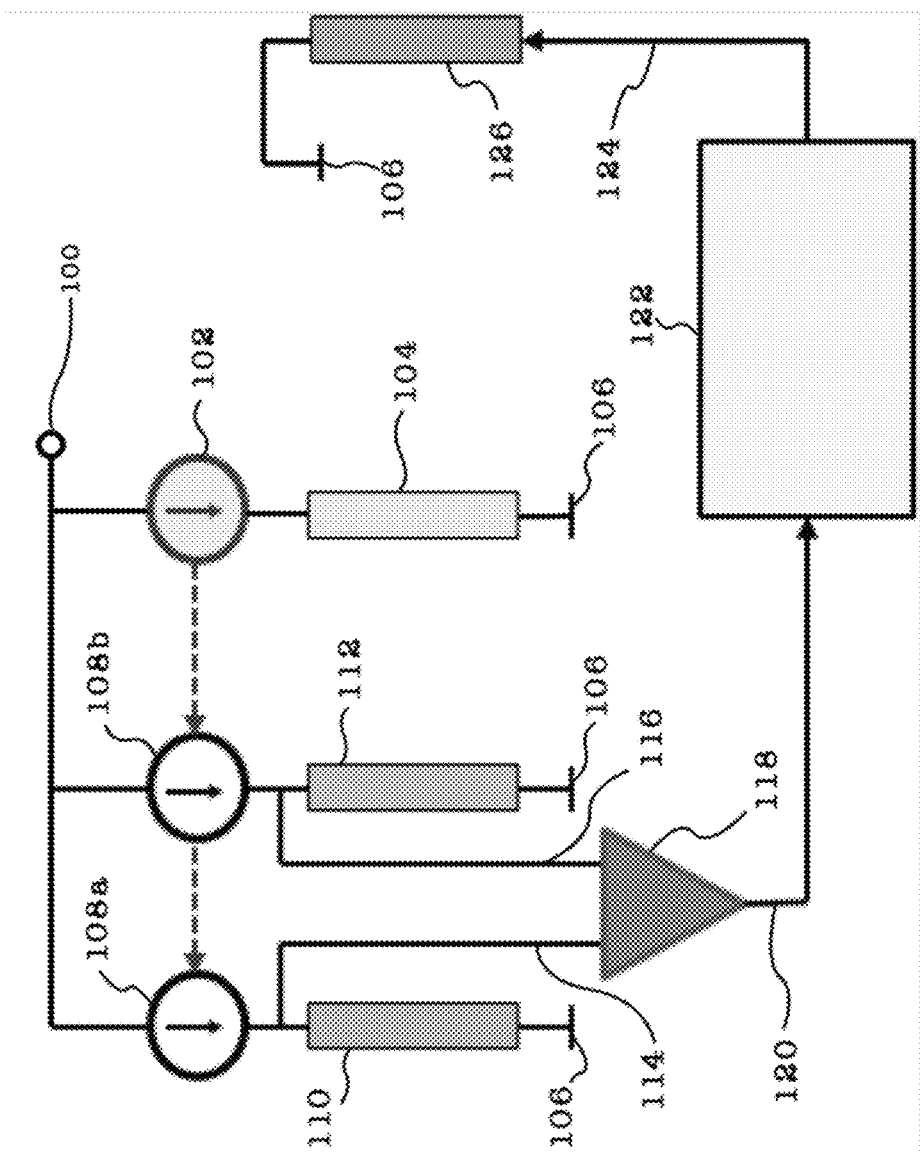
FIG. 1 is a schematic of a circuit with two different thin film resistors in parallel in accordance with an embodiment of the present invention.

Turning to FIG. 1, an embodiment with two different thin film resistors (Rs1 and Rs2), with different TCRs, is shown. A temperature coefficient describes the relative change of a physical property that is associated with a given change in temperature. For a property R (resistance), that changes by dR when the temperature changes by dT, the temperature coefficient a is defined by:

$$\frac{dR}{R} = \alpha dT.$$

The temperature dependence of electrical resistance and thus of electronic devices (wires, resistors) has to be taken into account when constructing devices and circuits. The temperature dependence of conductors is to a great degree linear and can be described by the approximation below:

$$\rho(T) = \rho_0[1 + \alpha_0(T - T_0)]$$

where $$\alpha_0 = \frac{1}{\rho_0}\left[\frac{\delta\rho}{\delta T}\right]_{T=T_0}$$

$\rho_0$ corresponds to the specific resistance temperature coefficient at a specified reference value (normally T=0° C.).

That of a semiconductor is however exponential:

$$\rho(T) = S\alpha^{\frac{B}{T}}$$

where S is defined as the cross sectional area and α and b are coefficients determining the shape of the function and the value of resistivity at a given temperature.

For both, α is referred to as the resistance temperature coefficient.

A positive temperature coefficient (PTC) refers to materials that experience an increase in electrical resistance when their temperature is raised. A negative temperature coefficient (NTC) refers to materials that experience a decrease in electrical resistance when their temperature is raised. In one embodiment, PTCs or NTCs may be used exclusively. In another embodiment, a combination of PTCs and NTCs may be used.

In FIG. 1, a supply voltage 100 is provided. The voltage goes across at least the reference resistor 104, the first resistor (Rs1) 110, and the second resistor (Rs2) 112. The current flowing through the reference resistor 104 to ground 106 is called the current source 102. The current mirrors 108a and 108b set the sum of the currents flowing in resistor 110 and output voltage branch 114, respectively, to be identical or approximately the same as the sum of the currents flowing in resistor 112 and output voltage branch 116, respectively. The currents flowing in the output voltage branches 114 and 116 may be much smaller (at least 10x and typically 100-1000× smaller) than the currents in the resistors 110 and 112 due to the high input impedance of the amplifier, and thus the currents in the resistors 110 and 112 are nearly the same. The current mirror may be a varying signal current. In FIG. 1, Rs1 and Rs2 are in parallel. The difference between the output voltages 114, 116 of the resistors 110, 112, respectively, may be amplified using a zero-drift electronic amplifier, or another differential amplifier, and may be employed as the controller 122 feedback error signal for the platform heater drive 126. Three commonly used types of zero-drift amplifiers—auto-zero amplifiers, choppers, and chopper-stabilized amplifiers—achieve small offsets in the range of nano-volts to micro-volts and extremely low offset drifts due to time and temperature. The amplifier's 1/f noise may be seen as a dc error, so it may be removed as well. Zero-drift amplifiers provide many benefits in several embodiments of the present invention, as temperature drift and 1/f noise, typically nuisances in the system, are otherwise very difficult to eliminate. In addition, zero-drift amplifiers may have higher open-loop gain, power-supply rejection, and common-mode rejection as compared to standard amplifiers; and their overall output error may be less than that obtained by a standard precision amplifier in the same configuration.

While other types of amplifiers may be used in other embodiments, a zero-drift amplifier is used in FIG. 1. The signal representing the difference between the output voltages 114, 116 may be so small that an incredibly high gain is required, but very high gain DC amplifiers may be harder to build with low offset and 1/f noise, and reasonable stability and bandwidth. A chopper circuit may be used to break up the input signal so that it can be processed as if it were an AC signal, then integrated back to a DC signal at the output. In this way, extremely small DC signals can be amplified. This approach is useful in several embodiments of the invention for its stability and accuracy.

The input offset voltage of the amplifier 118 may become important when trying to amplify small signals with very high gain. The input offset voltage is a parameter defining the differential DC voltage required between the inputs of an amplifier, especially an operational amplifier (op-amp), to make the output zero (for voltage amplifiers, 0 volts with respect to ground or between differential outputs, depending on the output type). An ideal op-amp amplifies the differential input; if this input is 0 volts (i.e. both inputs are at the same voltage with respect to ground), the output should be zero. However, due to manufacturing process, the differential input transistors of real op-amps may not be exactly matched. This causes the output to be zero at a non-zero value of differential input, called the input offset voltage. The chopper amplifier technique may create a very low input offset voltage amplifier that does not change much with time and temperature. Related techniques that also give these zero-drift advantages include auto-zero and chopper-stabilized amplifiers, any of which may be used in embodiments of the present invention.

Auto-zero amplifiers may use a secondary auxiliary amplifier to correct the input offset voltage of a main amplifier; they usually correct for input offset in two clock phases. Chopper-stabilized amplifiers may use a combination of auto-zero and chopper techniques to give some excellent DC precision specifications.

The first output voltage 114 of the first resistor 110 may feed into the $V_{in}+$ terminal of the amplifier 118, while the second output voltage 116 of the second resistor 112 may feed into the $V_{in}-$ terminal of the amplifier 118. The amplifier 118 may be powered by $V_s+$ and $V_s-$ supply voltages (not shown). They are often omitted from the diagram for simplicity. A person having ordinary skill in the art would appreciate that $V_s+$ and $V_s-$ may be present in the actual circuit.

$V_{out}$ 120 may feed into at least one proportional-integral-derivative controller (PID controller) 122, a control loop feedback mechanism. The PID controller 122 may continuously calculate an error value as the difference between a desired setpoint and a measured process variable. The controller 122 attempts to minimize the error over time by adjustment of a control variable, such as the power supplied to a heating element 126, to a new value determined by a weighted sum that may be represented as follows:

$$u(t) = K_p e(t) + K_i \int_0^t e(\tau) d\tau + K_d \frac{de(t)}{dt}$$

where $K_p$, $K_i$, and $K_d$ denote the coefficients for the proportional, integral, and derivative terms, respectively (sometimes denoted P, I, and D). P accounts for present values of the error. For example, if the error is large and positive, the control output will also be large and positive. I accounts for past values of the error. For example, if the current output is not sufficiently strong, error will accumulate over time, and the controller will respond by applying a stronger action. D accounts for possible future values of the error, based on its current rate of change. $V_{out}$ 120 may be used in the calculation of P, I and/or D in a given embodiment. A person having ordinary skill in the art would appreciate that a PID, PI, PD, P or I controller may be used in various embodiments of the present invention; and that more than one controller may be used in any combination and in various configurations such as cascade control, series or parallel form. The PID controller 122 may be implemented in different forms digitally or even using analog circuitry. The controller output 124 may drive the at least one platform heater 126. The power supplied to the platform heater 126, or the platform heater 126 temperature, may be increased, decreased, or kept constant in order to keep the temperature of the ovenized device constant.

The operation of the control loop shown in FIG. 1 is based on amplifying the difference in voltages across resistors 110 and 112, and applying it to a controller block 122, such as a PID controller. The controller applies electrical signal (voltage and/or current) to the heater 126 based on processing the output 120 of amplifier 118, which is the amplified difference in voltages of 114 and 116. The controller changes the heater electrical signal such that the difference in voltages 114 and 116 is zero or approximately zero. Any input offset voltage at the amplifier may be equivalent to a difference voltage, which makes the amplifier output not proportional to the difference in voltages 114 and 116. An input offset voltage may result in an error proportional to the offset value. Said error may then cause an error in the heater controller signal. Thus, eliminating or minimizing the offset and eliminating or minimizing drift helps with improving the overall accuracy of the oven temperature control and its stability.

Figure 2:
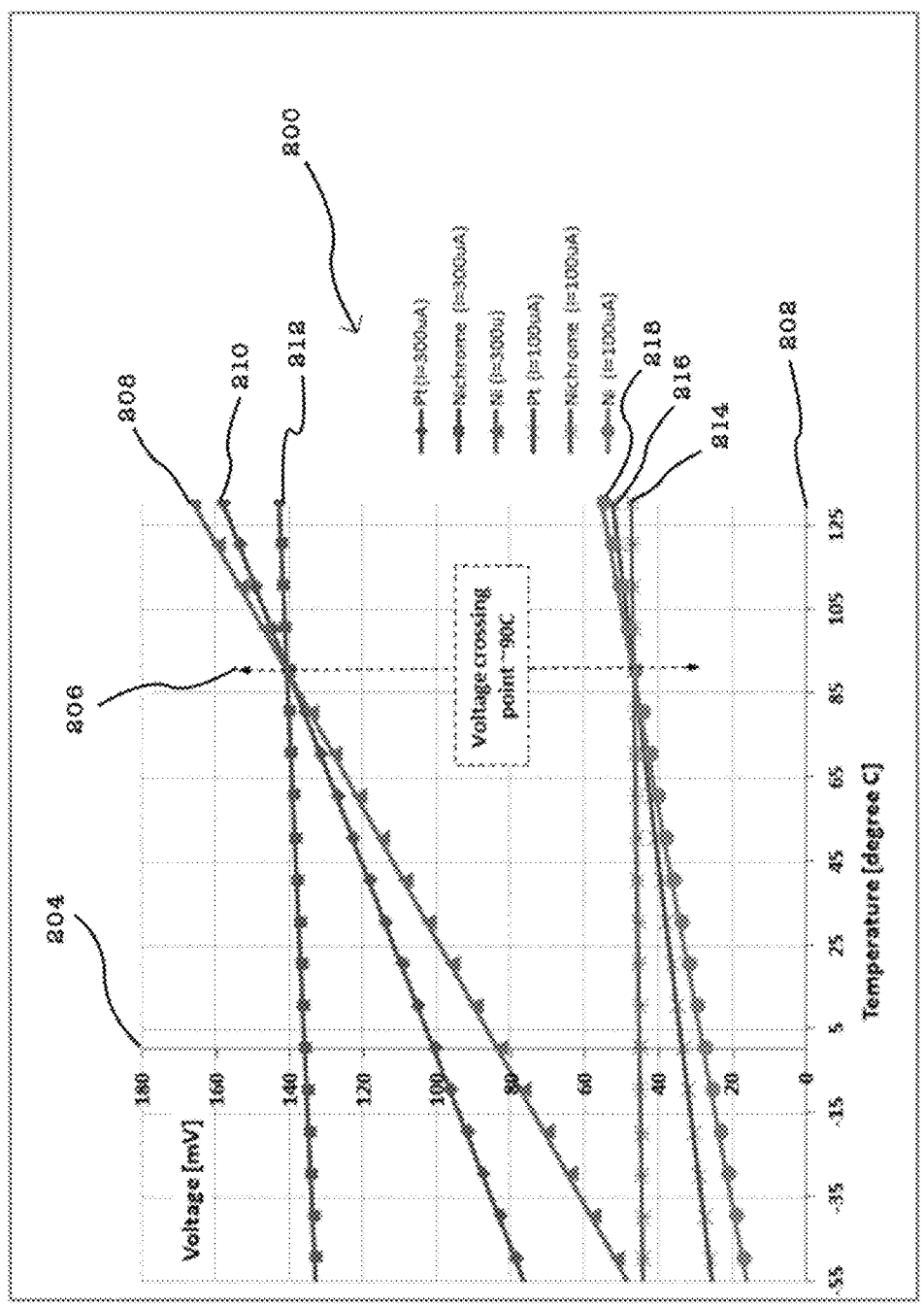
FIG. 2 is a graphical representation of a circuit where various thin film resistors are employed in accordance with an embodiment of the present invention.

Turning now to FIG. 2, a graphical representation of the circuit operation 200 of the embodiments employing platinum (Pt), Nickel (Ni) and nickel-chrome (nichrome or NiCr) thin film resistors is shown. These resistors may be formed by thin-film deposition, in MEMS, integrated circuit (IC), and/or vacuum deposit processing. Lithography, spin-coating, and/or etching techniques may be used. These thin film resistors may be manufactured to show high, long-term stability. A person having ordinary skill in the art would appreciate that thick film resistors, sense resistors, and resistance thermometers (resistance temperature detectors (RTDs)) may also be used in various embodiments of the present invention. In another embodiment, the resistors may be individual discrete resistors, with different TCRs and/or initial resistance values, that are assembled with the ovenized device (sensors, resonator, or electronics). In some embodiments, Rs1 and Rs2 may have different types of thin film deposition. In some embodiments, Rs1 and Rs2 may have the same type of thin film deposition. In some embodiments, Rs1, Rs2, and Rref may have the same type of thin film deposition. In other embodiments, Rs1, Rs2, and Rref may all have different thin film depositions. In yet another embodiment, Rref has no thin film deposition. In another embodiment, Rref has the same thin film deposition as either Rs1 or Rs2.

The x-axis displays temperature in degrees Celsius, while the y-axis displays voltage in millivolts. The upper three lines show the results when a 300 microamps (µA) drive current is used. Because Pt, Ni, and NiCr all have a positive TCR, as the platform heater increases the temperature, the thin film resistors' resistance increases. When Rs1 has a Pt thin film 210, the output voltage at 90° C. is 141 mV. When Rs1 has a Ni thin film 208, the output voltage at 90° C. is 141 mV. When Rs1 has a NiCr thin film 212, the output voltage at 90° C. is 141 mV. This shows that with a 300 µA drive current, there is a given temperature, 90° C. 206, at which the resistor output voltages cross the same point. The lower three lines show the results when a 100 µA drive current is used. When Rs1 has a Pt thin film 216, the output voltage at 90° C. is 47 mV. When Rs1 has a Ni thin film 218, the output voltage at 90° C. is 47 mV. When Rs1 has a NiCr thin film 214, the output voltage at 90° C. is 47 mV. At 300 µA and 100 µA, the voltage crossing point is found at 90° C. This demonstrates that whether Rs1 has a Pt, Ni, or Nichrome thin film, the temperature at which the resistor output voltages cross the same point is fixed independent of the drive current.

FIG. 2 illustrates PTC materials with resistances that have a linear, or approximately linear, relationship with temperature, which is the most common case in metals. Other embodiments may comprise NTC materials or a set of mixed materials with both PTC and NTC properties. Materials that have a linear relationship with temperature, and as a result have one crossing point, may be well suited for at least one embodiment of the invention. In other embodiments of the invention, the TCR value, which may equal the slope of the resistance vs. temperature, may vary at a large temperature range. As a result, the resistance vs. temperature plot may become a non-linear curve. However, regardless of the shape of the curve, and the number of crossing points on the two resistance vs. temperature plots of the two selected materials for R1 110 and R2 112, the described implementation may still function as long as the two materials have a crossing point at the desired fixed temperature. In at least one embodiment of the invention, the crossing points should not be too close, e.g. <2° C., such that the system becomes unstable or can only reach another temperature set point that is not corresponding to the desired cross point. In another embodiment the values of resistors are chosen such that the "first" temperature crossing point (i.e. the "first" is the closest temperature to the initial temperature) is the desired crossing point. Furthermore, the above principle may be applied to other embodiments using semiconductors or a set of mixed materials with both semiconductors and metals. As long as the two curves of the resistance vs. temperature plots have a crossing point at the desired temperature. The configuration can be potentially implemented with the described temperature control scheme. The initial resistance value of a resistor may be its room-temperature resistance value.

The crossing point temperature of the resistors need not be 90° C. in every embodiment. The crossing point of the output voltage of the resistors may be set by their geometrical design e.g. sheet resistance multiplied by the number of squares and/or the difference between the resistors' TCRs. This may allow a user to determine an ideal temperature at which to run the oven. For example, a thin film resistor with a thickness T and made of material M may be formed with a rectangular pattern with a length of 100 micron and width of 2 micron. This 100 micron by 2 micron rectangle may be divided into 50 squares, each square having a length and width of 2 micron (i.e. ratio of length/width of the rectangle). The sheet resistance is a constant value based on the material M's electrical property and the resistor thickness T. The total resistance is the number of squares multiplied by the sheet resistance value.

In a regular three-dimensional conductor, the resistance can be written as:

$$R = \rho \frac{L}{A} = \rho \frac{L}{Wt}$$

where $\rho$ is the resistivity, A is the cross-sectional area and L is the length. The cross-sectional area can be split into the width W and the sheet thickness t. Upon combining the resistivity with the thickness into one term, the resistance can then be written as:

$$R = \frac{\rho}{t} \frac{L}{W} = R_s \frac{L}{W}$$

where $R_s$ is the sheet resistance. If the film thickness is known, the bulk resistivity $\rho$ may be calculated by multiplying the sheet resistance by the film thickness in cm.

$$\rho = R_s \cdot t$$

Thus, the sheet resistance is a measure of resistance of thin films that are nominally uniform in thickness. And a given sheet resistance multiplied by the number of squares equals the total resistance.

For semiconductors doped through diffusion or surface peaked ion implantation, the sheet resistance may be defined using the average resistivity of the material:

Given the average resistivity is:

$$\bar{\rho} = \frac{1}{\bar{\sigma}}$$

Then sheet resistance is:

$$R_s = \bar{\rho}/x_j = (\bar{\sigma} x_j)^{-1} = \frac{1}{\int_0^{x_j} \sigma(x) dx}$$

which in materials with majority-carrier properties may be approximated by (neglecting intrinsic charge carriers):

$$R_s = \frac{1}{\int_0^{x_j} \mu q N(x) dx}$$

where $x_j$ is the junction depth, $\mu$ is the majority-carrier mobility, q is the carrier charge and N(x) is the net impurity concentration in terms of depth. Knowing the background carrier concentration $N_B$ and the surface impurity concentration, the sheet resistance-junction depth product $R_s x_j$ may be found using Irvin's curves, which are numerical solutions to the above equation.

Turning back to FIG. 2, the crossing point temperature may be set by the TCR electrical material properties of the resistors 110 and 112, and their values, which could be set in different forms, including their geometries. The current mirrors matching may be independent of the temperature variations to the first order when the mirrors are tightly placed on the same integrated circuit (IC). By placing the current mirror on the ovenized platform itself, the stability may be further improved. The current mirrors may not be exactly identical in practice and a small variance (1 µA or less) in current output may exist. However, as long as the current provided by the mirrors is stable over the temperature, a fixed current mismatch of the two mirrors may only cause the desired temperature set point to slightly change to another value (usually within a degree or two), but may cause zero or approximately zero drifting of temperature over time. The current mirrors 108a and 108b may mirror, be identical or substantially the same as, current source 102.

In one embodiment, high temperature annealing of the resistors may be employed to further reduce drift of the resistor material properties after deposition. In another embodiment, a single crystalline silicon layer may be employed as one of the resistors. In another embodiment, a single crystalline silicon layer may be employed on one of the resistors. In yet another embodiment, the current may be pulsed to help reduce the current density and/or prevent electromigration.

Figure 3:
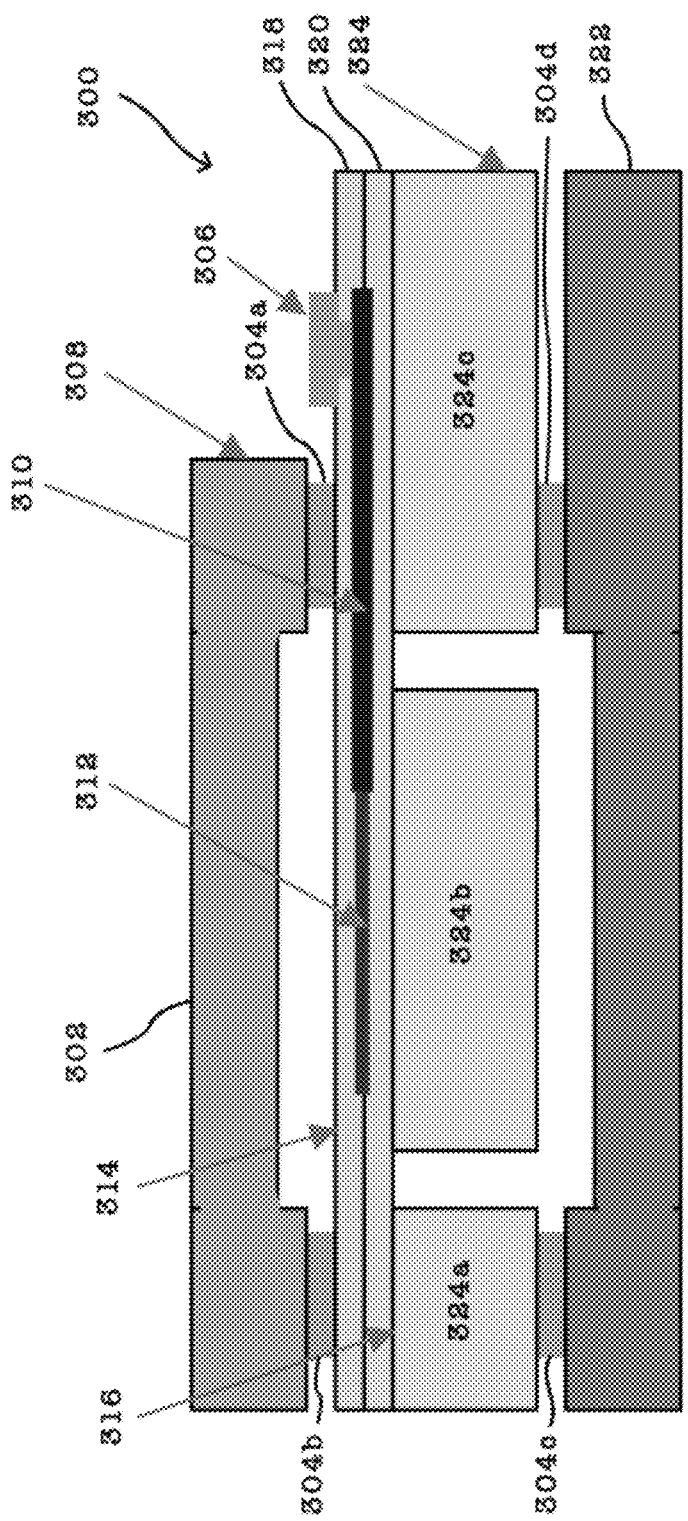
FIG. 3 is an illustration of resistors integrated in a suspended micro-platform in accordance with an embodiment of the present invention.

Turning now to FIG. 3, an embodiment, where the resistors are integrated with a suspended micro-platform 300 to make the operation of the oven at micro-scale more energy efficient, is shown. The oven is covered on the top by a cap wafer 302 and on the bottom by a bottom wafer 322. The dicing lines 308 and 324 are where the wafer dicing may take place. Lines 318 and 320 may also be in line with the dicing lines as well. Wafer dicing is the process by which die are separated from a wafer of semiconductor following the processing of the wafer. Here, the dicing process may be accomplished by scribing and breaking, dice before grind, mechanical sawing (normally with a machine called a dicing saw), or laser cutting. The electrical pads 304a, 304b, 304c, 304d may be used to provide a buffer between the wafers and the middle of the oven; they may also be used as points of electrical contact for the circuit. Electrical pad 306 may have a free-end or may be connected to the cap wafer in another embodiment. Electrical pad 306 may be used to provide a buffer between the wafer and the middle of the oven, or may be used as a point of electrical contact for the circuit.

Electrical pads 304a and 304b may be connected to a first oxide layer 314. The first oxide layer 314 may cover at least the top of Rs1, Rs2, the platform heater, and the electrical lead transfer 310, collectively 312. Electrical lead transfer 310 may be connected to at least one section of the circuit. Electrical lead transfer 310 may also be attached to electrical pad 306. The electrical lead 310 may be used for physical support, to transfer power, to probe the circuit, to transmit information, or as a heat sink. The second oxide layer 316 may cover the bottom of at least Rs1, Rs2, the platform heater, and the electrical lead transfer 310, collectively 312. The second oxide layer 316 may be connected to a single, undivided thermal platform. The thermal platform may also be divided into multiple parts. In FIG. 3, thermal platform 324 is divided into the left thermal platform 324a, the middle thermal platform 324b, and the right thermal platform 324c. In other embodiments, the thermal platform may be divided in 1, 2, 4, 5, 6, 7, 8, 9, 10, or more parts.

Figure 4:
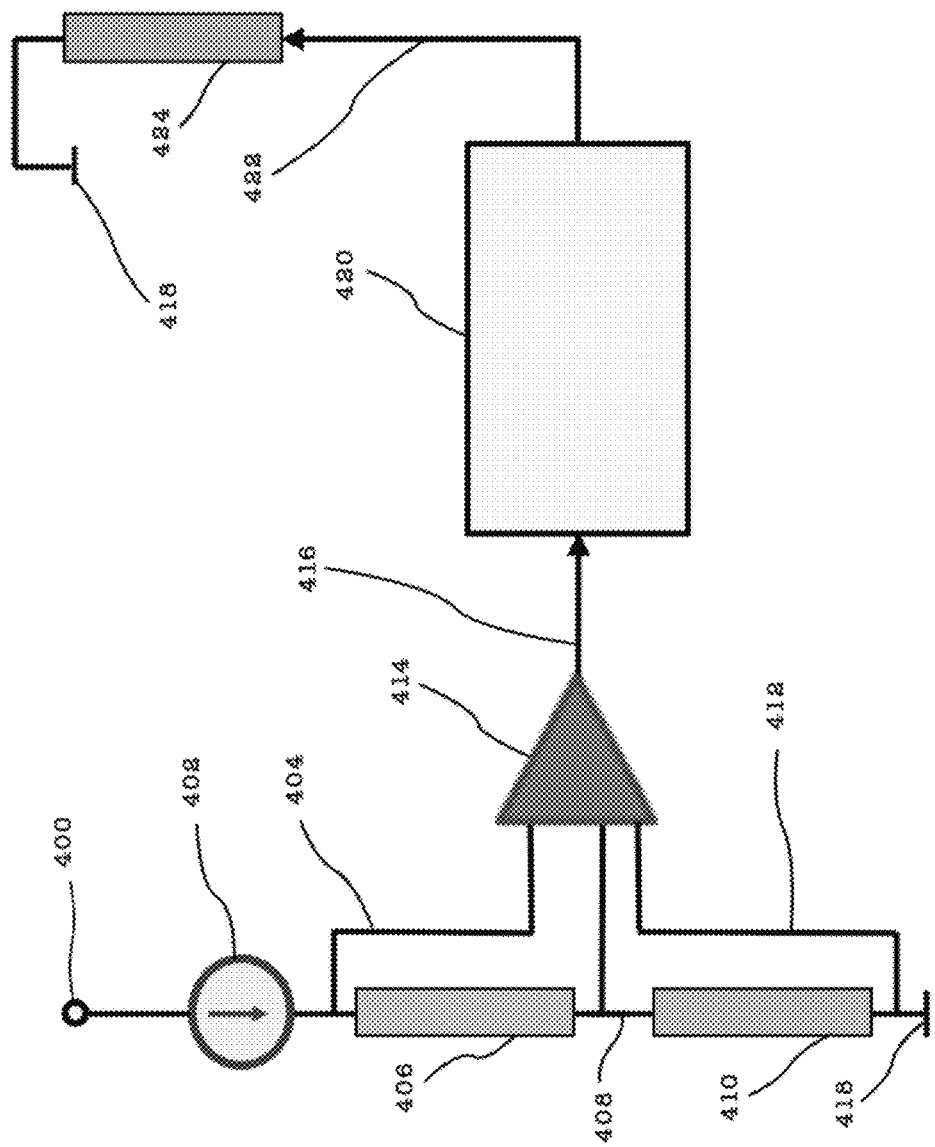
FIG. 4 is a schematic of a resistor network where the resistors are placed in series and a single common current source is employed in accordance with an embodiment of the present invention.

Turning to FIG. 4, an embodiment of the resistor network, where the resistors are placed in series and a single common current source is employed, is shown. In FIG. 4, a supply voltage 400 is provided. A single current source 402 flows through at least the first resistor (Rs1) 406, and the second resistor (Rs2) 410. In FIG. 4, Rs1 and Rs2 are in series. The difference between the first output voltage 404 of the Rs1 406 and the second output voltage 408 of Rs2 410 may be amplified using an auto-zero electronic amplifier 414, or another differential amplifier, and may be employed as the controller 420 feedback error signal for the platform heater drive 424. The first output voltage 404 of the first resistor 406 may feed into the $V_{in}+$ terminal of the amplifier, while the second output voltage 408 of the second resistor 410 may feed into the $V_{in}-$ terminal of the amplifier 414. A third amplifier terminal 412 may be connected to ground 418. The amplifier 414 may be powered by the $V_s+$ and $V_s-$ supply voltages (not shown). They are often omitted from the diagram for simplicity. A person having ordinary skill in the art would appreciate that $V_s+$ and $V_s-$ may be present in the actual circuit.

The amplifier output voltage, $V_{out}$ 416, may feed into at least one proportional-integral-derivative controller (PID controller) 420, a control loop feedback mechanism. A person having ordinary skill in the art would appreciate that a PID, PI, PD, P or I controller may be used in various embodiments of the present invention; and that more than one controller may be used in any combination and in various configurations such as cascade control, series or parallel form. The PID controller 420 may be implemented in a different forms digitally or even using analog circuitry. The controller output 422 may drive the at least one platform heater 424, which may be connected to ground 418. The power supplied to the platform heater 424, or the platform heater 424 temperature, may be increased, decreased, or kept constant in order to keep the temperature of the ovenized device constant. The controller 420 may adjust the power driven to the heater 424 such that the voltages across resistors 406 and 410 are the same or approximately the same.

Other variations of the disclosed systems and methods not limited to various materials, shape, form-factor, or means of manufacturing, assembly and integration of the resistors with the oven may be employed based on the present disclosure.

Also, one having ordinary skill in the art may employ the disclosed systems and methods in other circuit or electrical network topologies for the sense and control of the oven temperature. These variations could include moving the current source to one of the resistor branches and/or mirroring its current in at least one other element. In another embodiment of the invention, at least one of the current mirrors 108a and 108b is replaced by a new current source or current source 102. In yet another embodiment of the invention, at least one of the current mirrors 108a and 108b is replaced by a current source, while current source 102 and resistor 104 are removed from the circuit. In yet another embodiment of the invention, current mirror 108a is replaced by a current source, which is mirrored in 108b, while current source 102 and resistor 104 are removed from the circuit. In another embodiment, each current mirror 108a and 108b is replaced by a separate current source, while current source 102 and resistor 104 are removed from the circuit. Another variation could include placing the resistors in series and employing a single common current source and a variation of the voltage difference amplifier, as shown in FIG. 4. Also, a person having ordinary skill in the art may use the disclosed systems and methods with at least one cooling element instead of a heater or in conjunction with a heater to control the temperature of a device.

It should be noted that the features illustrated in the drawings are not necessarily drawn to scale, and features of one embodiment may be employed with other embodiments as the skilled artisan would recognize, even if not explicitly stated herein. Descriptions of well-known components may be omitted so as to not unnecessarily obscure the embodiments.

While multiple embodiments are disclosed, still other embodiments of the present invention will become apparent to those skilled in the art from this detailed description. The invention is capable of myriad modifications in various obvious aspects, all without departing from the spirit and scope of the present invention. Accordingly, the drawings and descriptions are to be regarded as illustrative in nature and not restrictive.

The invention claimed is:

1. A system for controlling the temperature of a device, the system comprising:
   a first resistor;
   a second resistor;
   a current source;
      at least one current mirror for driving at least one of the first or second resistors,
   wherein the current mirror mirrors the current source;
   an amplifier configured to amplify a voltage difference between a first output voltage of the first resistor and a second output voltage of the second resistor, wherein the voltage difference is set to zero at a specific temperature that is based on the difference between a TCR of the first resistor and a TCR of the second resistor; and
   a controller configured to control a heater by changing the heater electrical signal such that the voltage difference is approximately zero, based on an output of the amplifier.

2. The system of claim 1, wherein the first resistor is driven by the current source and the second resistor is driven by the current mirror.

3. The system of claim 1, wherein the at least one current mirror drives the first resistor and a second current mirror drives the second resistor.

4. The system of claim 1, wherein the temperature is set by setting the voltage difference to zero.

5. The system of claim 1, wherein the voltage difference is set to zero at a set temperature based on the fact that a TCR of the first resistor and a TCR of the second resistor have different values, and an initial resistance of the first resistor and an initial resistance of the second resistor have different values.

6. The system of claim 1, wherein the first resistor and the second resistor are constructed with different materials.

7. The system of claim 1, wherein the resistance values of the first and second resistors are set by their geometries.

8. A system for controlling the temperature of a device, the system comprising:
- a first resistor driven by a first current source;
- a second resistor driven by a second current source;
- an amplifier configured to amplify a voltage difference between a first output voltage of the first resistor and a second output voltage of the second resistor wherein the temperature at which the difference is zero depends on the difference in the TCR of a set of resistors; and
- a controller configured to control a heater, based on an output of the amplifier.

9. The system of claim 8, wherein the first and second current sources have the same current values.

10. The system of claim 8, wherein the first and second current sources have different current values.

11. The system of claim 8, wherein the temperature is set by setting the voltage difference to zero.

12. The system of claim 8, wherein the voltage difference is set to zero at a set temperature based on the difference between a TCR of the first resistor and a TCR of the second resistor.

13. The system of claim 12, wherein the voltage difference is set to zero at a set temperature based on the fact that a TCR of the first resistor and a TCR of the second resistor have different values, and an initial resistance of the first resistor and an initial resistance of the second resistor have different values.

14. The system of claim 8, wherein the first resistor and the second resistor are constructed with different materials.

15. The system of claim 8, wherein the resistance values of the first and second resistors are set by their geometries.

16. A method of controlling a temperature of a device, the method comprising the steps of:
- heating the device;
- sensing the temperature;
- calculating a voltage difference between a first output voltage of a first resistor and a second output voltage of a second resistor;
- amplifying the voltage difference; and
- controlling a heater, based on the amplified voltage difference, in order to match the first output voltage of the first resistor with the second output voltage of the second resistor, wherein the voltage difference is set to zero at a specific temperature that is based on the difference between a TCR of the first resistor and a TCR of the second resistor.

17. The method of claim 16, wherein a TCR of the first resistor is different than a TCR of the second resistor and wherein the step of controlling the heater is performed via a controller changing the heater electrical signal such that the voltage difference is approximately zero.

18. The method of claim 16, wherein the current in the first and second resistors are the same.

19. The method of claim 16, wherein the current in the first and second resistors are different.

20. A system for controlling the temperature of a device, the system comprising:
- a first resistor;
- a second resistor;
- a current source for driving the first resistor and the second resistor;
- an amplifier configured to amplify a voltage difference between a first output voltage of the first resistor and a second output voltage of the second resistor, wherein the voltage difference is set to zero at a specific temperature that is based on the difference between a TCR of the first resistor and a TCR of the second resistor; and
- a controller configured to control a heater, based on an output of the amplifier.

21. The system of claim 20, wherein the temperature is set by setting the voltage difference to zero.

22. The system of claim 21, wherein the voltage difference is set to zero at a set temperature based on the fact that a TCR of the first resistor and a TCR of the second resistor have different values, and an initial resistance of the first resistor and an initial resistance of the second resistor have different values.

23. The system of claim 20, wherein the first resistor and the second resistor are constructed with different materials.

24. The system of claim 20, wherein the resistance values of the first and second resistors are set by their geometries.

* * * * *